(12) United States Patent
Jian et al.

(10) Patent No.: US 7,696,775 B2
(45) Date of Patent: Apr. 13, 2010

(54) APPARATUS OF IMPEDANCE MATCHING FOR OUTPUT DRIVER AND METHOD THEREOF

(75) Inventors: Liu Jian, Hsinchu (TW); Peng-Zhan Zhang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/566,017

(22) Filed: Dec. 1, 2006

(65) Prior Publication Data

US 2007/0139123 A1 Jun. 21, 2007

(30) Foreign Application Priority Data

Dec. 1, 2005 (CN) .................... 2005 1 0129721

(51) Int. Cl.
H03K 17/16 (2006.01)
H03K 19/003 (2006.01)

(52) U.S. Cl. .................... 326/30; 326/86
(58) Field of Classification Search .............. 326/30
See application file for complete search history.

(56) References Cited

U.S. PATENT DOCUMENTS

| | | | | | |
|---|---|---|---|---|---|
| 5,134,311 | A | * | 7/1992 | Biber et al. ............. 327/108 |
| 6,084,434 | A | * | 7/2000 | Keeth ...................... 326/87 |
| 6,118,310 | A | * | 9/2000 | Esch, Jr. ................ 327/108 |
| 6,501,293 | B2 | * | 12/2002 | Braceras et al. ............ 326/30 |
| 6,570,402 | B2 | * | 5/2003 | Koo et al. ................. 326/30 |
| 6,590,413 | B1 | * | 7/2003 | Yang ..................... 326/30 |
| 6,636,069 | B1 | * | 10/2003 | Muljono ................. 326/30 |
| 6,686,763 | B1 | * | 2/2004 | Yen ...................... 326/30 |
| 6,741,095 | B2 | * | 5/2004 | Abrosimov et al. ........ 326/30 |
| 6,836,144 | B1 | * | 12/2004 | Bui et al. ................. 326/32 |
| 6,836,170 | B2 | * | 12/2004 | Kitagawa et al. ........ 327/308 |
| 6,894,529 | B1 | * | 5/2005 | Chong et al. ............. 326/30 |
| 6,909,305 | B1 | * | 6/2005 | Li et al. .................. 326/30 |
| 6,944,071 | B2 | * | 9/2005 | Martin ................... 365/198 |
| 6,958,661 | B2 | * | 10/2005 | Thompson et al. ........ 333/17.3 |
| 6,963,218 | B1 | * | 11/2005 | Alexander et al. .......... 326/30 |
| 7,084,663 | B2 | * | 8/2006 | Oguri ..................... 326/30 |
| 7,106,095 | B2 | * | 9/2006 | Kim et al. ................ 326/30 |
| 7,123,055 | B1 | * | 10/2006 | Chong et al. ............. 326/87 |
| 7,196,540 | B2 | * | 3/2007 | Ueno .................... 326/30 |
| 7,535,251 | B2 | * | 5/2009 | Morishima et al. ......... 326/30 |
| 7,541,831 | B2 | * | 6/2009 | Kim ..................... 326/30 |
| 7,545,164 | B2 | * | 6/2009 | Song et al. ............... 326/30 |
| 7,646,229 | B2 | * | 1/2010 | Mei ..................... 327/170 |

(Continued)

Primary Examiner—Vibol Tan
Assistant Examiner—Matthew C. Tabler
(74) Attorney, Agent, or Firm—Thomas, Kayden, Horstemeyer & Risley

(57) ABSTRACT

An apparatus for impedance matching circuit is disclosed. The impedance matching apparatus has an output driver for outputting an output signal and includes an output data generator, for generating an output data signal; an output stage, for generating the output signal according to the output data signal, and receiving a first control signal to adjust an impendence of the output stage; an impendence unit, electrically coupled to the output stage, for receiving a second control signal to adjust an impedance of the impedance unit; and a calibration circuit electrically coupled to the output stage and the impedance unit, for outputting the first control signal and the second control signal to respectively control the output stage and the impedance unit such that a sum of impedances of the output stage and the impedance unit is adjusted to compensate an environment factor of the chip.

18 Claims, 4 Drawing Sheets

U.S. PATENT DOCUMENTS

| | | | |
|---|---|---|---|
| 2002/0190746 A1* | 12/2002 | Abrosimov et al. | 326/30 |
| 2003/0006799 A1* | 1/2003 | Ruesch | 326/30 |
| 2004/0017220 A1* | 1/2004 | To et al. | 326/30 |
| 2004/0124874 A1* | 7/2004 | Kurts et al. | 326/30 |
| 2004/0201401 A1* | 10/2004 | Morris | 326/30 |
| 2005/0104620 A1* | 5/2005 | Ueno | 326/30 |
| 2005/0110517 A1* | 5/2005 | Chandler et al. | 326/30 |
| 2005/0151562 A1* | 7/2005 | Kurts et al. | 326/30 |
| 2005/0242830 A1* | 11/2005 | Humphrey et al. | 326/30 |

* cited by examiner

APPARATUS OF IMPEDANCE MATCHING FOR OUTPUT DRIVER AND METHOD THEREOF

FIELD OF THE INVENTION

The present invention relates to impedance matching, and more particularly to an apparatus of impedance matching.

BACKGROUND OF THE INVENTION

In a data transmission system, the quality of transmitting and receiving data will be affected by an impedance matching, particularly for the increasingly faster speed of data transmissions.

Referring to FIG. 1 for a schematic circuit diagram of performing an impedance matching in accordance with a prior art, an external resistor is used for impedance matching, and the conventional method is simple, easy and direct, but it still has the following drawbacks:

(1) The conventional method requires external cascade resistors and incurs a higher system cost.
(2) Since the impedance seen by the reflection waves is the sum of the internal output driver impedance and the impedance of external cascade resistors, and the internal output driver impedance varies with an environment factor of a chip such as at least one of manufacture process, operational voltage, and temperature (P.V.T.), the conventional method cannot be used to achieve a better impedance matching.

Referring to FIG. 2 for a schematic circuit diagram of performing impedance matching by a self-calibrated resistor matrix in a chip in accordance with a prior art, the resistor matrix is adopted in the chip, and the self-calibration mechanism is adopted for the impedance matching. This conventional method integrates the resistor matrix into the chip to lower the system cost, wherein the resistor matrix is comprised of a plurality of resistors and a plurality of switches, but its drawback resides on that the resistor matrix used in the chip occupies a larger area and incurs a higher die cost.

SUMMARY OF THE INVENTION

Therefore, a primary object of the present invention is to provide an impedance matching circuit to solve the aforementioned problem.

To achieve the foregoing object, the present invention provides an output driver located in a chip, for outputting an output signal, and the output driver comprises: an output data generator, for generating an output data signal; an output stage, electrically coupled to the output data generator, for generating the output signal according to the output data signal, and receiving a first control signal to adjust an impedance of the output stage; an impedance unit, electrically coupled to the output stage, for receiving a second control signal to adjust an impedance of the impedance unit; and a calibration circuit, electrically coupled to the output stage and the impedance unit, for outputting the first control signal and the second control signal to respectively control the output stage and the impedance unit such that a sum of impedances of the output stage and the impedance unit is adjusted to compensate an environment factor of the chip.

A second object of present invention is to provide another output driver for outputting an output signal, and the output driver comprises: an output data generator, for generating an output data signal; an output stage, electrically coupled to the output data generator, for generating the output signal according to the output data signal, and receiving a control signal to adjust an impedance of the output stage; an impedance unit, electrically coupled to the output stage, for receiving the control signal to adjust an impedance of the impedance unit; and a calibration circuit, electrically coupled to the output stage and the impedance unit, for outputting the control signal to adjust the impedances of the output stage and the impedance unit. A sum of the impedances of the output stage and the impedance unit is adjusted according to the control signal to achieve a predetermined impedance.

A third object of the present invention is to provide a method for impedance matching, and the method comprises: generating a control signal by a calibration circuit according to a resistance of a reference resistor; receiving an output data signal; adjusting impedances of an output stage and an impedance unit according to the control signal such that the impedances of the output stage and the impedance unit correspond to the resistance of the reference resistor; generating an output signal according to the output data signal by the output stage; and outputting the output signal through the impedance unit.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THE PREFERRED EMBODIMENTS

The present invention relates to an impedance matching apparatus. While the specifications describe at least one embodiment of the invention considered best modes of practicing the invention, it should be understood that the invention can be implemented in many ways and is not limited to the particular examples described below or to the particular manner in which any features of such examples are implemented.

Figure 1:
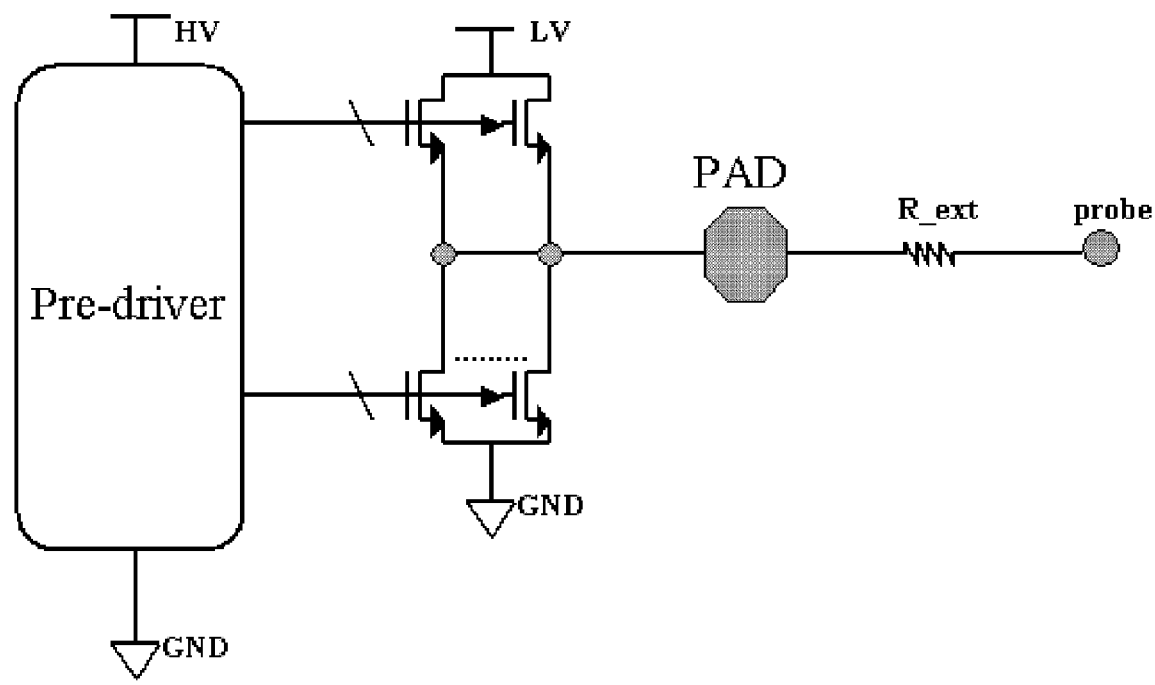
FIG. 1 is a schematic circuit diagram of the structure of an external resistor performing an impedance matching in accordance with a prior art.
Figure 2:
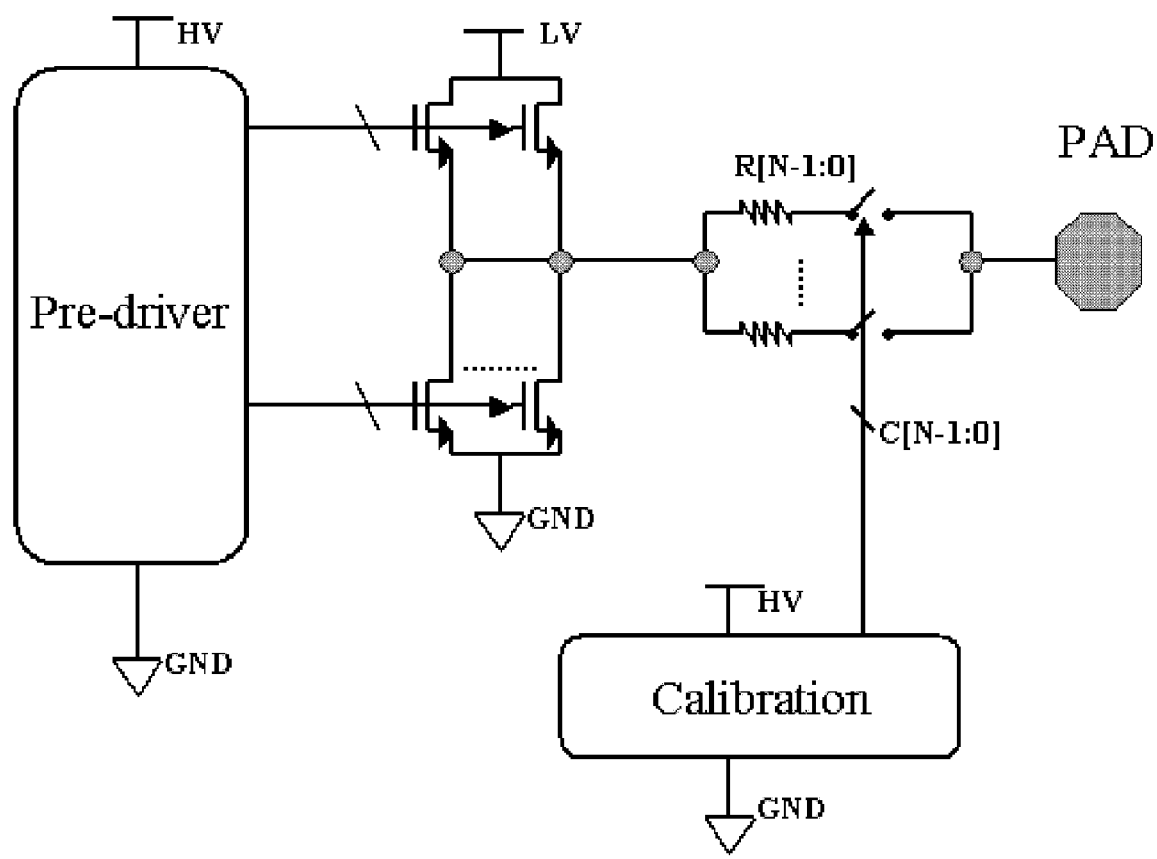
FIG. 2 is a schematic circuit diagram of the structure of another external resistor performing an impedance matching in accordance with a prior art.
Figure 3:
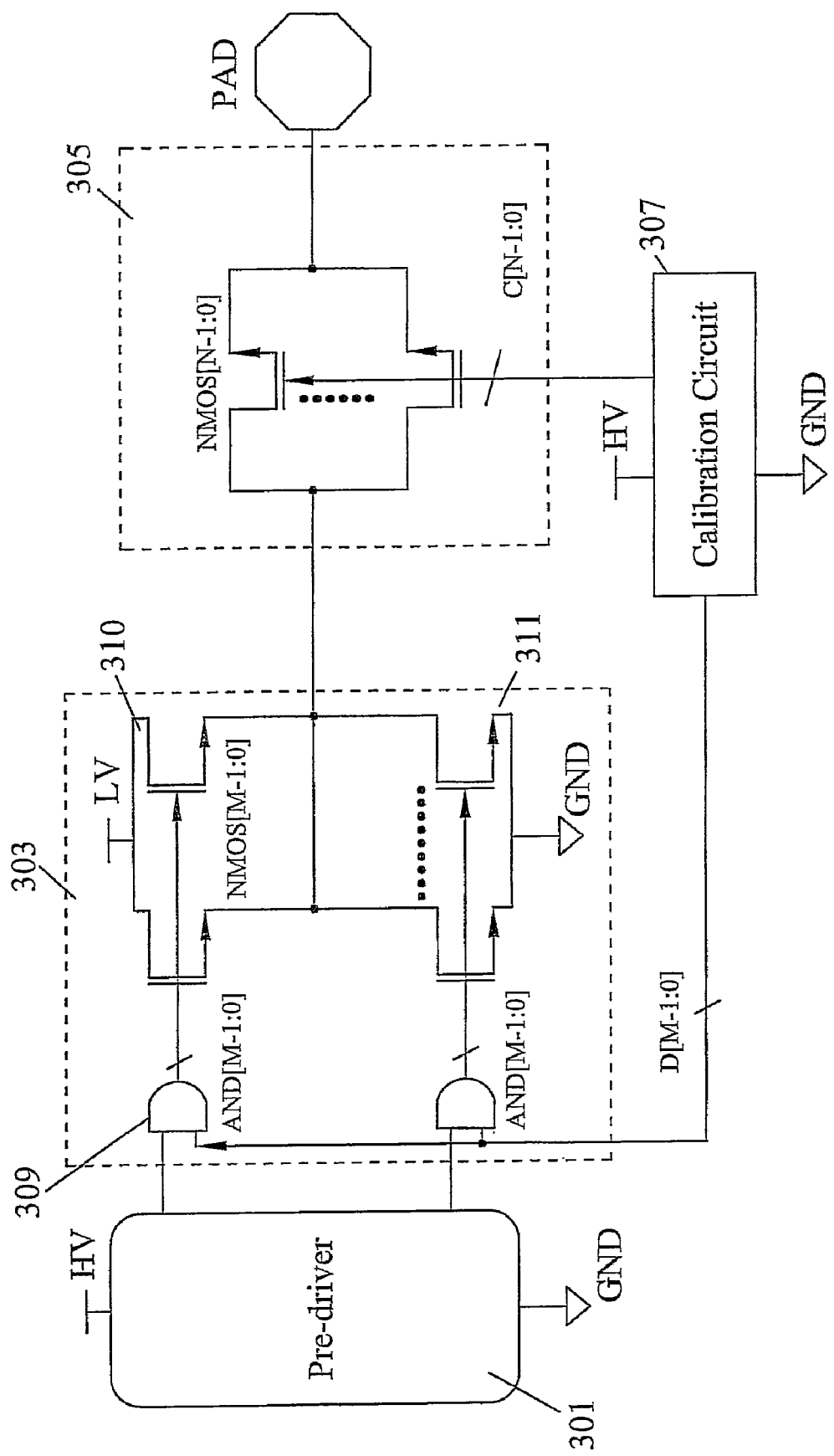
FIG. 3 is a schematic circuit diagram of an impedance matching apparatus in accordance with the present invention.

Referring to FIG. 3 for a schematic circuit diagram of an impedance matching apparatus in accordance with a preferred embodiment of the present invention, the impedance matching apparatus 300 comprises: a pre-driver 301, an output driver stage 303, an impedance unit 305, and a calibration circuit 307. In an application with a low amplitude output (such as 0.7V) as illustrated in this embodiment, the output driver stage 303 adopts a structure of cascade N-type metal oxide semiconductor (NMOS) transistors 310, 311 and the impedance unit 305 adopts a plurality of NMOS transistors connected in parallel. It is noteworthy to point out that the NMOS transistors are used for illustration only and not intended to limit the scope of the invention.

In a preferred embodiment, the pre-driver 301 adopts a high voltage HV (such as 3.3V), and the output of the pre-driver 301 is used as a gate voltage of the NMOS transistor 310, 311 in the output driver stage 303, and a drain of the NMOS transistor 310 of the output driver stage 303 is connected to a low voltage LV (such as 0.7V). The low voltage LV is used to set the amplitude of an output signal of an output end PAD and supplied by the external power source or produced by a voltage regulator circuit (not shown in the figure) in the chip. The calibration circuit 307 includes two groups of control signals D[M-1:0] and C[N-1:0], wherein D[M-1:0] is used for controlling the output of an impedance at the NMOS transistor 310 of the output driver stage 303, and C[N-1:0] is used for controlling the impedance of an adjustable impedance unit 305 (such as a plurality of NMOS transistors connected in parallel) which is coupled between the output driver stage 303 and the output end PAD. In an embodiment, the output driver stage 303 further includes a plurality of logic elements (such as AND gates), for receiving control signals D[M-1:0] to control the number of electrically connected NMOS transistors 310 and NMOS transistors 311 and adjust the impedance of the output driver stage 303.

Figure 4:
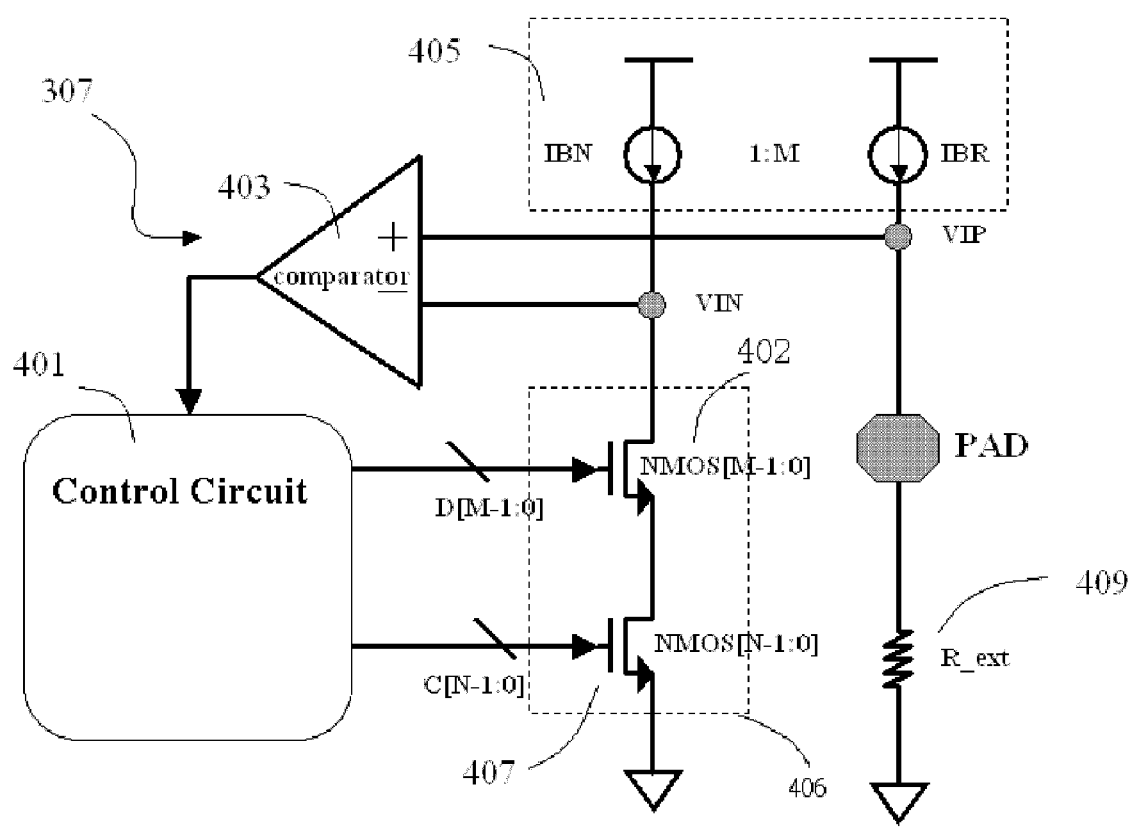
FIG. 4 is a schematic circuit diagram of the structure of a calibration circuit of an impedance matching apparatus in accordance with the present invention.

Referring to FIG. 4 for a schematic circuit diagram of the structure of a calibration circuit of an impedance matching apparatus in accordance with the present invention, the calibration circuit 307 comprises: a control logic 401, a comparator 403, a current source 405, a calibrating resistor unit 406, and a resistor 409. The calibrating resistor unit 406 is used for tracking a change of impedance of the output driver stage 303 or the impedance unit 305, or both. In other words, the calibrating resistor unit 406 is made with the same material by the same process of the output driver stage 303 or the impedance unit 305 or both. The resistor 409 is a component not easily affected by process, voltage and temperature (P.V.T.) and can be an external resistor installed outside the chip. In an embodiment, the transistor 402 of the calibrating resistor unit 406 is very similar to the NMOS transistor 310 of the output driver stage 303, and the total resistance is controlled by D[M-1:0]. The transistor 407 of the calibrating resistor unit 406 is very similar to the transistor of the impedance unit 305, and the total resistance is controlled by C[N-1:0]. In an embodiment, the control logic 401 comprises a up/down counter for receiving the output of the comparator 403 and increasing or decreasing the first control signal D[M-1,0] and the second control signal C[N-1,0] according to the output of the comparator 403.

The following is derived from the principle of an embodiment according to the present invention:

The current source 405 generates currents IBN and IBR separately with a specific ratio such as:

$$IBR = M \times IBN \qquad \text{Equation (1)}$$

The calibrating resistor unit 406 includes a plurality of NMOS transistors 402 and a plurality of NMOS transistors 407.

It is assumed that the resistor Rmirror (Sum of cascade resistors of NMOS transistors 402 and NMOS transistors 407) of the calibrating resistor unit 406 is equal to the sum of resistance of the NMOS transistor 310 of the output driver stage 303 and the impedance unit (NMOS transistor) 305 multiplied by N.

$$R_{mirror} = N \times (R_{n1} + R_{n2}) \qquad \text{Equation (2)}$$

Where, $R_{mirror}$ is the sum of cascade resistors of mirror NMOS 402, 407, and $R_{n1}$ is the impedance of the NMOS transistor 310 of the output driver stage 303, and $R_{n2}$ is the impedance of the impedance unit (NMOS transistor) 305.

The current IBN of the current source 405 flows into the calibrating resistor unit 406, and the produced voltage is given below:

$$VIN = IBN \times (R_{mirror}) = IBN \times N \times (R_{n1} + R_{n2}) \qquad \text{Equation (3)}$$

Another current IBR of the current source 405 flows into an external resistor R_ext 409, and the produced voltage is given below:

$$VIP = IBR \times R\_ext \qquad \text{Equation (4)}$$

The inputs of the comparator 403 are VIN and VIP, and a compare result is outputted and sent to the digital control circuit 401. The digital control circuit 401 adjusts the output signals C[N-1:0] and D[M-1:0] by a negative feedback according to the compare result. In the meantime, the output signal C[N-1:0] adjusts the impedance of the NMOS transistor 407 and the impedance of the NMOS transistor 305. The output signal D[M-1:0] adjusts the impedance of the mirror NMOS transistor 402 and the impedance of the NMOS transistor 310 of the output driver stage 303 to maintain a ratio of their impedances to N.

After several times of comparisons, VIN gradually approaches VIP, and finally VIN and VIP are substantially equal (its deviation depends on the minimum resolution of the resistor of the NMOS transistor).

$$IBN \times R_{mirror} = IBN \times N \times (R_{n1} + R_{n2}) = IBR \times R\_ext \qquad \text{Equation (5)}$$

Equations (1) and (5) are combined to obtain $$N \times (R_{n1} + R_{n2}) = M \times R\_ext \qquad \text{Equation (6)}$$

$$(R_{n1} + R_{n2}) = M/N \times R\_ext \qquad \text{Equation (7)}$$

Since R_ext 409 is an external resistor which will not be affected by P.V.T, therefore the sum of impedances of $R_{n1}$ and $R_{n2}$ will not be related to P.V.T.

The effect of process, voltage and temperature (P.V.T.) on the impedance of the output driver stage 303 or the impedance unit 305 or both can be overcome by comparing the voltages outputted by the calibrating resistor unit 406 and the resistor 409 by the calibration circuit 307 to output C[N-1:0] and D[M-1:0] to adjust the output driver stage 303, or the impedance unit 305 or both. In a 10 preferred embodiment, the sum of impedances of the transistor 402 and cascade transistors 407 is compared with the resistor 409, and the control circuit 401 adjusts the impedances of the output driver stage 303 and the impedance unit 305, such that the sum of cascade resistors corresponds to the impedance of the resistor 409 to compensate the effect of P.V.T. on the impedance.

In a preferred embodiment, the value of a gate voltage (Vg) of the transistor 310 and cascade transistors 305 is higher than the value of their source voltage (Vs) such as Vs=0.7 V, Vg=3.3 V, and the maximum value of a drain voltage of these transistors is the amplitude of the output signal (such as 0.7V), and thus the condition Vds<Vgs can be satisfied, and both can be operated in a linear region. By adjusting the dimensions (i.e., aspect ratio) of the transistor, a smaller area can be achieved for a matching resistor of 50 ohms. Since the amplitude of the output signal is smaller (that is, a change of source voltage at the NMOS transistor 310 and the NMOS transistor 305 is small), therefore the change of a gate-source voltage difference (Vgs) of the transistors 310, 305 is also small, and the change of impedance of the transistors 310, 305 will be negligible.

In summation of the description above, an application with low amplitude of an output signal (such as 0.7 V, LVDS (Low Voltage Differential Signaling) or RSDS (Reduced Swing Differential Signaling) standard)) can adopt a small change of output impedance of the transistors 310, 305 and the feature of occupying a small area for a better impedance matching. By adjusting the impedance of the output driver stage 303 or the impedance unit 305 or both made by the calibration circuit 307, the overall output impedance of the circuit will be equal to the impedance of a transmission line outside the chip, so as to achieve the impedance matching.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An output driver, located in a chip, having an output end for outputting an output signal comprising:
   an output data generator, for generating an output data signal;
   an output stage, having a plurality of logic elements and a cascade of MOS transistors that are electrically coupled to the output data generator, for generating the output signal according to the output data signal, and receiving a first control signal to adjust an impedance of the output stage;
   an impedance unit, electrically coupled between the output stage and the output end and having a plurality of MOS transistors connected in parallel, for receiving a second control signal to adjust an impedance of the impedance unit; and
   a calibration circuit, electrically coupled to the output stage and the impedance unit, the calibration circuit having two groups of control signals, wherein the first group of control signals are electrically connected to the logic elements for controlling a number of electrically connected MOS transistors of the output stage, wherein the second group of control signals are connected to the plurality of MOS transistors of the impedance unit, to control the output stage and the impedance unit such that a sum of impedances of the output stage and the impedance unit is adjusted to compensate an environment factor of the chip.

2. The output driver of claim 1, wherein the impedance of the output stage is adjusted by changing an aspect ratio of the first transistors.

3. The output driver of claim 2, wherein the impedance of the output stage is adjusted by a feedback control.

4. The output driver of claim 1, wherein the output stage receives a first voltage corresponding to an amplitude of the output signal.

5. The output driver of claim 4, wherein when a voltage of the output data signal is larger than the first voltage, the first transistors operate in a linear region.

6. The output driver of claim 1, wherein the impedance unit is a transistor resistor matrix, and an equivalent impedance of the transistor resistor matrix is adjusted by changing the aspect ratio of the transistor resistor matrix.

7. The output driver of claim 1, wherein the calibration circuit further comprises:
   a current source, for providing a first current and a second current, the first current corresponding to the second current;
   a resistor unit, electrically coupled to the current source, for receiving the first current to generate a compare voltage, and the impedance of the resistor unit corresponding to the impedance of the output stage and the impedance of the impedance unit;
   a reference resistor, electrically coupled to the current source, for receiving the second current to generate a reference voltage;
   a comparator, for comparing the reference voltage with the compare voltage, and outputting a compare result; and
   a control circuit, electrically coupled to the comparator, for receiving the compare result to generate the first and the second control signal.

8. The output driver of claim 7, wherein an impedance of the resistor unit corresponds to the impedances of the output stage and the impedance unit.

9. The output driver of claim 1, wherein a supply voltage of the output stage is for setting the amplitude of the output signal and is lower than a supply voltage of the output data generator.

10. An output driver, having and output end and for outputting an output signal, comprising:
    an output data generator, for generating an output data signal;
    an output stage, having a plurality of logic elements and a cascade of MOS transistors that are electrically coupled to the output data generator, for generating the output signal according to the output data signal, and receiving a control signal to adjust an impedance of the output stage;
    an impedance unit, electrically coupled between the output stage and the output end and having a plurality of MOS transistors connected in parallel, for receiving the control signal to adjust an impedance of the impedance unit; and
    a calibration circuit, electrically coupled to the output stage and the impedance unit, the calibration circuit having two groups of control signals, wherein the first group of control signals are electrically connected to the logic elements for controlling a number of electrically connected MOS transistors of the output stage, wherein the second group of control signals are connected to the plurality of MOS transistors of the impedance unit, to adjust the impedances of the output stage and the impedance unit;
    wherein a sum of the impedances of the output stage and the impedance unit is adjusted according to the first and second group of control signals to achieve a predetermined impedance.

11. The output driver of claim 10, wherein an amplitude of the output signal becomes smaller, and the change of impedance of the output stage becomes smaller.

12. The output driver of claim 10, wherein the plurality of MOS transistors of the output stage comprises a plurality of first transistors and a plurality of second transistors, gates of the first transistors receive the output data signal, drains of the first transistors receive a first voltage, and voltage of the output data signal is larger than a the first voltage.

13. The output driver of claim 12, wherein when a voltage of the output data signal is larger than the first voltage, the first transistors operate in a linear region.

14. The output driver of claim 10, wherein a supply voltage of the output stage is for setting the amplitude of the output signal and is lower than a supply voltage of the output data generator.

15. A method for impedance matching, comprising:
generating two groups of control signals by a calibration circuit according to a resistance of a reference resistor;
receiving an output data signal;
adjusting impedances of an output stage according to the first group of control signals and an impedance unit according to the second group of control signals such that the impedances of the output stage and the impedance unit correspond to the resistance of the reference resistor, wherein the first group of control signals control a plurality of MOS transistors in the output stage that are connected in a cascade arrangement and the second group of control signals control a plurality of MOS transistors in the impedance unit that are connected in parallel;
generating an output signal according to the output data signal by the output stage; and
outputting the output signal through the impedance unit;
wherein a supply voltage of the output stage is for setting the amplitude of the output signal and is lower than a supply voltage of the output data generator.

16. The method of claim 15, wherein the impedance of the output stage is adjusted by changing the aspect ratio of the plurality of first transistors.

17. The method of claim 15, wherein the output stage receives a first voltage, and the first voltage corresponds to an amplitude of the output signal.

18. The method of claim 15, wherein a sum of impedances of the output stage and the impedance unit is adjusted according to the control signal to achieve a predetermined impedance.

* * * * *